US012660523B2

(12) United States Patent
Saito et al.

(10) Patent No.: US 12,660,523 B2
(45) Date of Patent: Jun. 16, 2026

(54) METHOD FOR MANUFACTURING SEMICONDUCTOR DEVICE

(71) Applicant: Kioxia Corporation, Tokyo (JP)

(72) Inventors: Yuta Saito, Yokkaichi (JP); Shinji Mori, Nagoya (JP); Hiroyuki Yamashita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 1097 days.

(21) Appl. No.: 17/695,280

(22) Filed: Mar. 15, 2022

(65) Prior Publication Data

US 2023/0048781 A1     Feb. 16, 2023

(30) Foreign Application Priority Data

Aug. 12, 2021     (JP) ................................. 2021-131790

(51) Int. Cl.
| | |
|---|---|
| *H10P 14/60* | (2026.01) |
| *H10D 84/01* | (2026.01) |
| *H10D 84/03* | (2025.01) |
| *H10D 84/83* | (2025.01) |
| *H10P 14/692* | (2026.01) |

(52) U.S. Cl.
CPC ..... *H10P 14/6309* (2026.01); *H10D 84/0144* (2025.01); *H10D 84/038* (2025.01); *H10D 84/83* (2025.01); *H10P 14/69215* (2026.01);

*H10P 14/6927* (2026.01); *H10P 14/6939* (2026.01); *H10P 14/69391* (2026.01); *H10P 14/69392* (2026.01); *H10P 14/69394* (2026.01); *H10P 14/69395* (2026.01); *H10P 14/69396* (2026.01)

(58) Field of Classification Search
None
See application file for complete search history.

(56) References Cited

U.S. PATENT DOCUMENTS

| | | |
|---|---|---|
| 6,287,988 B1 | 9/2001 | Nagamine et al. |
| 2004/0157473 A1 | 8/2004 | Hayashi et al. |
| 2004/0235254 A1 | 11/2004 | Inumiya et al. |

FOREIGN PATENT DOCUMENTS

| | | |
|---|---|---|
| JP | H11-145131 A | 5/1999 |
| JP | 2004-214493 A | 7/2004 |
| JP | 4719166 B2 | 7/2011 |
| KR | 10-2010-0026423 A | 3/2010 |

*Primary Examiner* — Alexander G Ghyka
(74) *Attorney, Agent, or Firm* — Finnegan, Henderson, Farabow, Garrett & Dunner, LLP

(57) ABSTRACT

A method for manufacturing a semiconductor device of an embodiment includes: forming a first film on a semiconductor layer containing silicon (Si), the first film containing a metal element and oxygen (O) and having a first thickness; and forming a second film between the semiconductor layer and the first film using radical oxidation, the second film containing silicon (Si) and oxygen (O) and having a second thickness larger than the first thickness.

12 Claims, 13 Drawing Sheets

FIG.1A
FIG.1B
FIG.1C
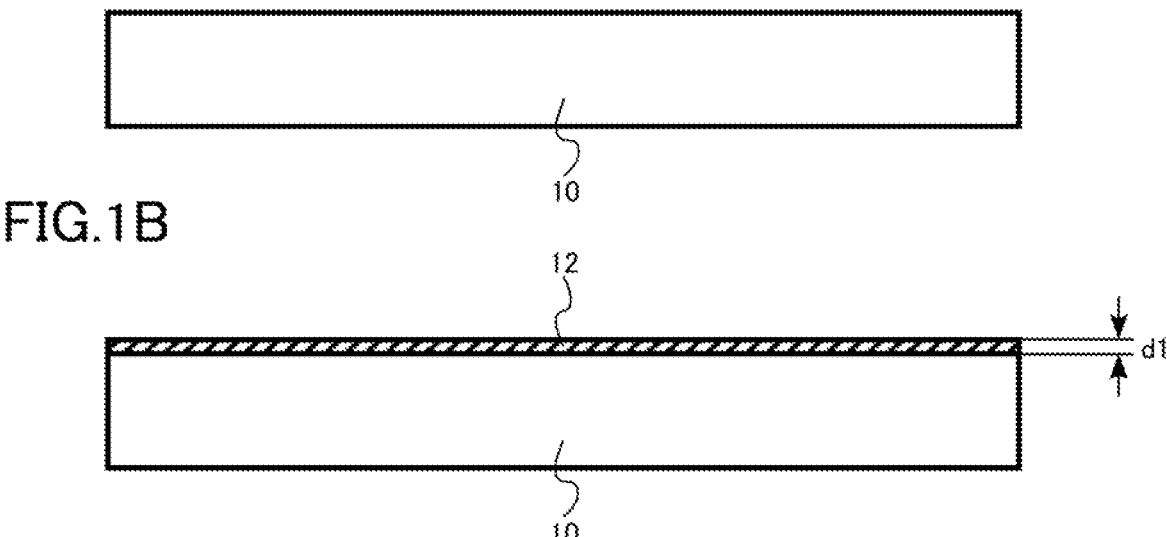
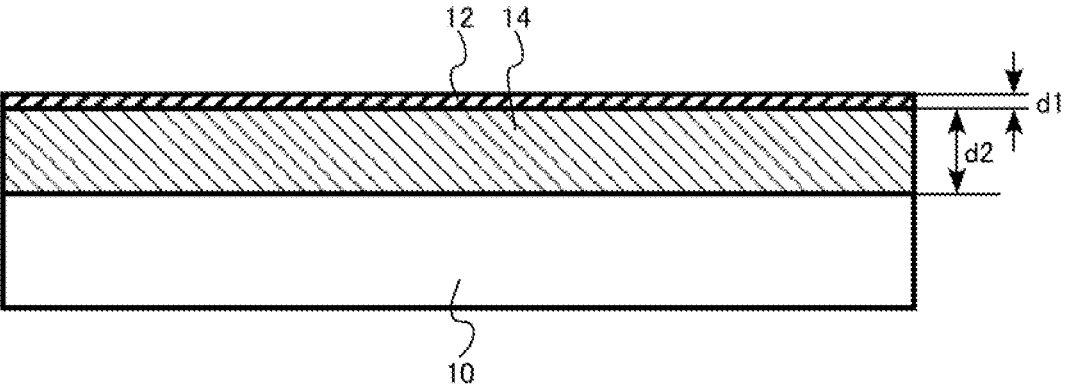

FIG.3A
FIG.3B
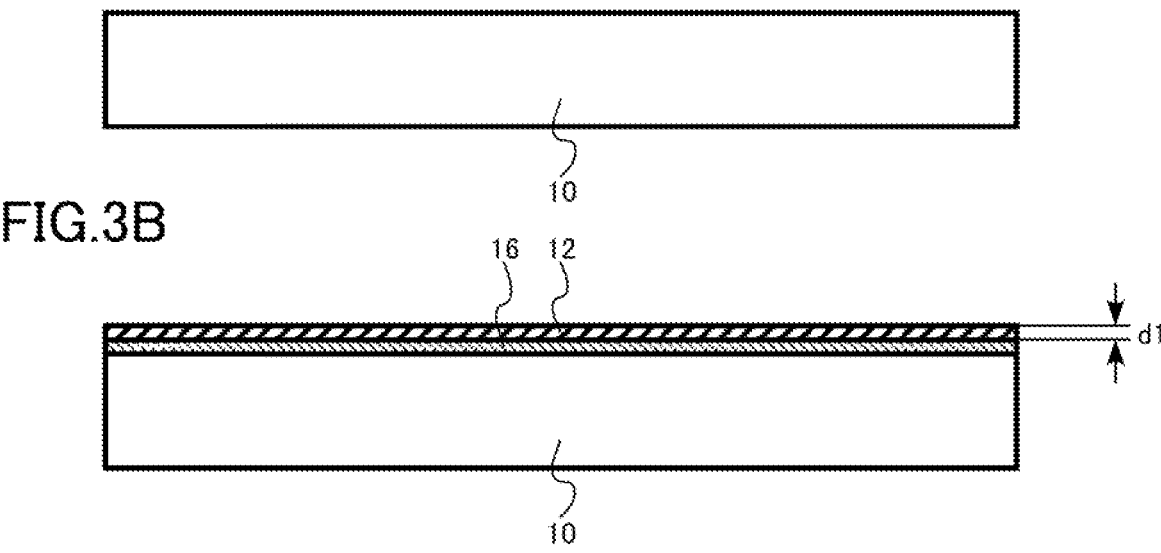
FIG.3C
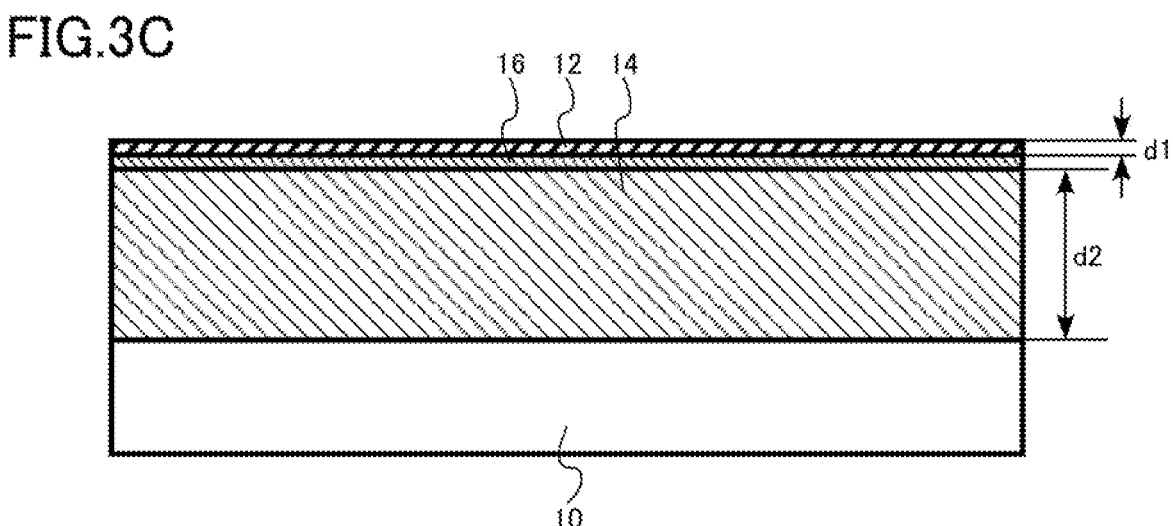

FIG.6A
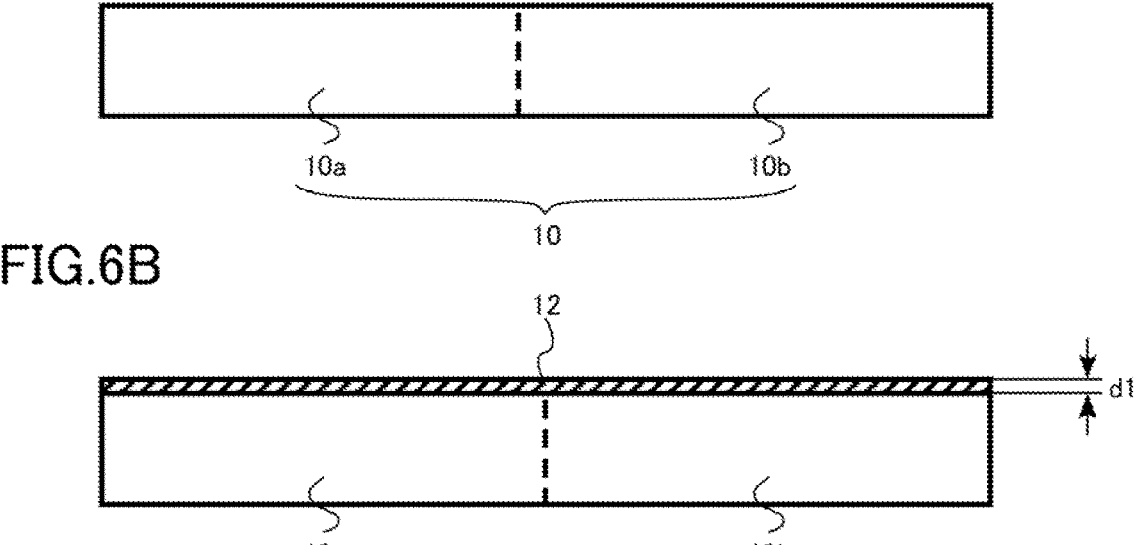
FIG.6B
FIG.6C
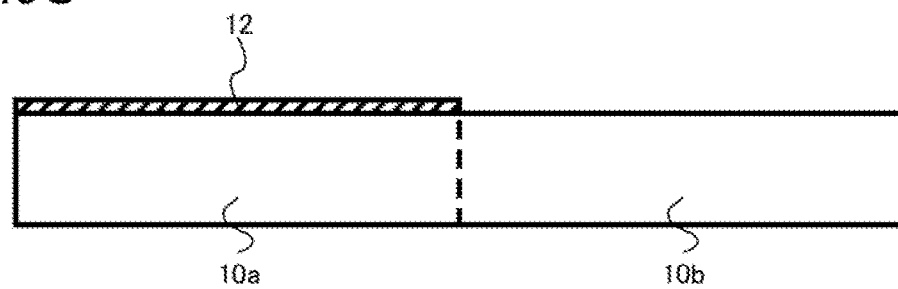
FIG.6D

FIG.7A
FIG.7B
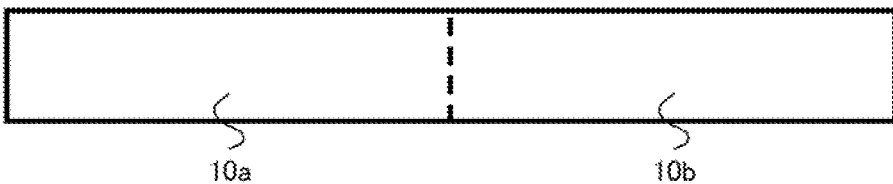
FIG.7C
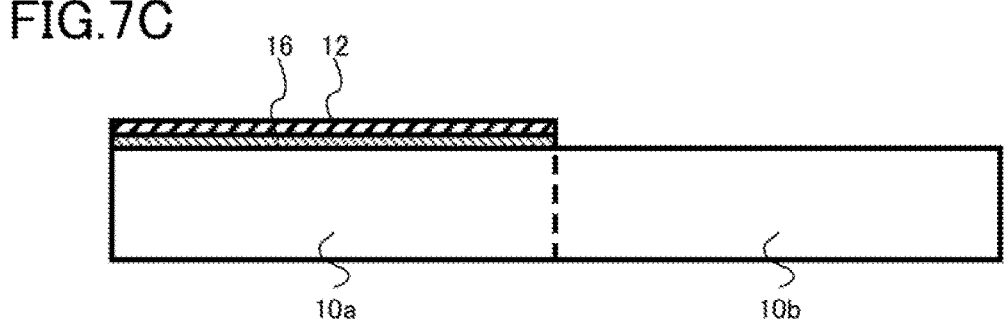
FIG.7D
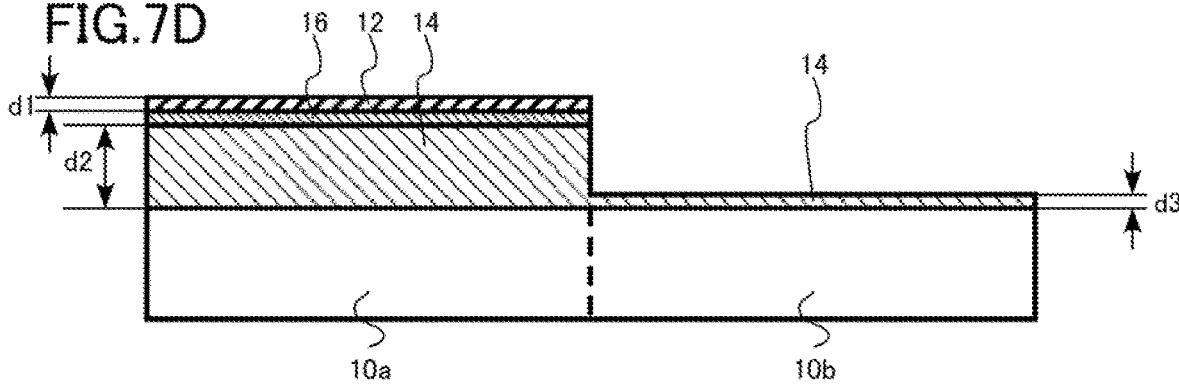

FIG.9A
FIG.9B
FIG.9C
FIG.9D
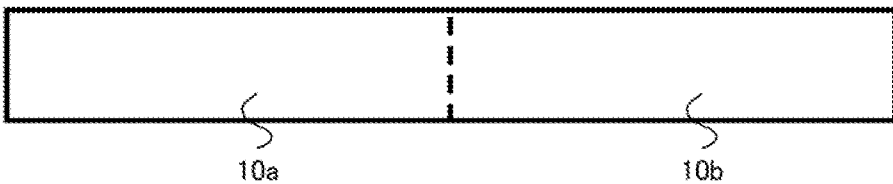
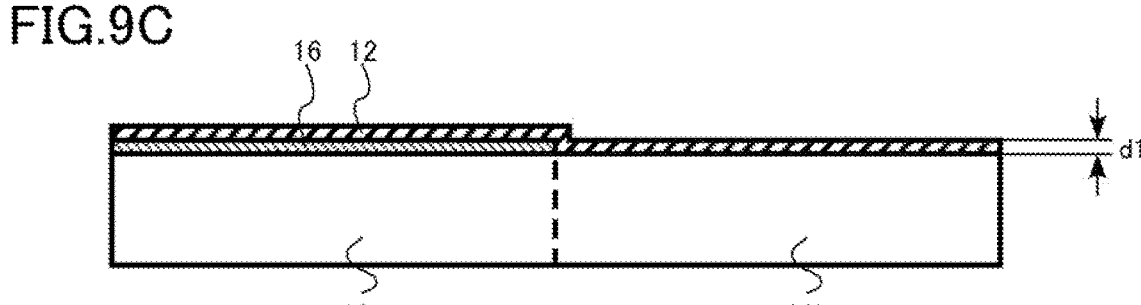
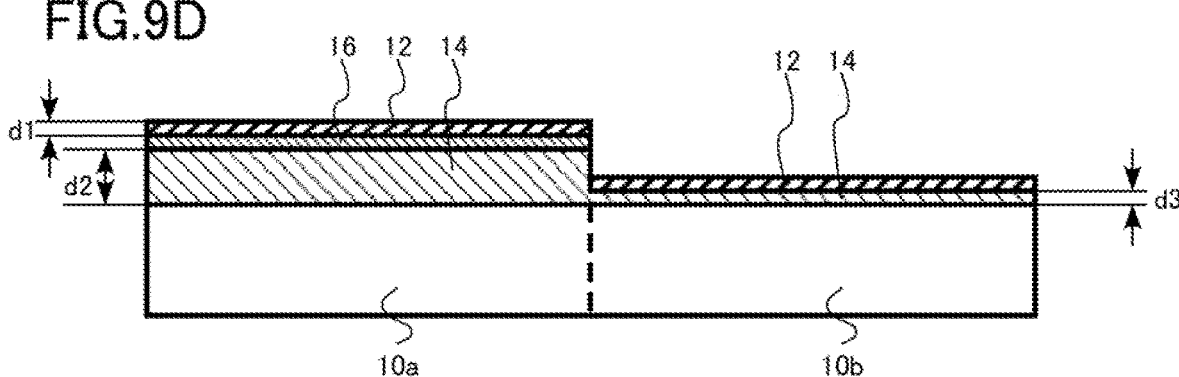

FIG.11A
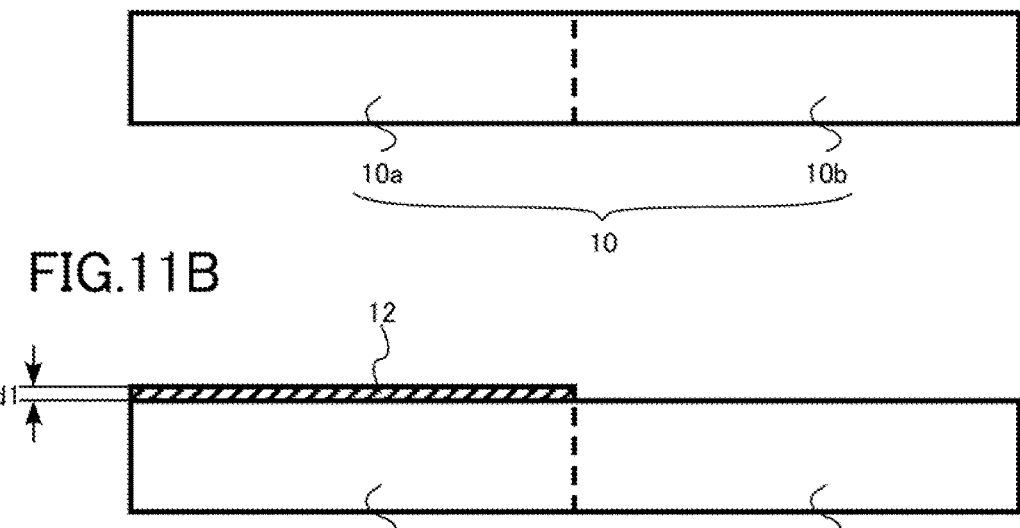
FIG.11B
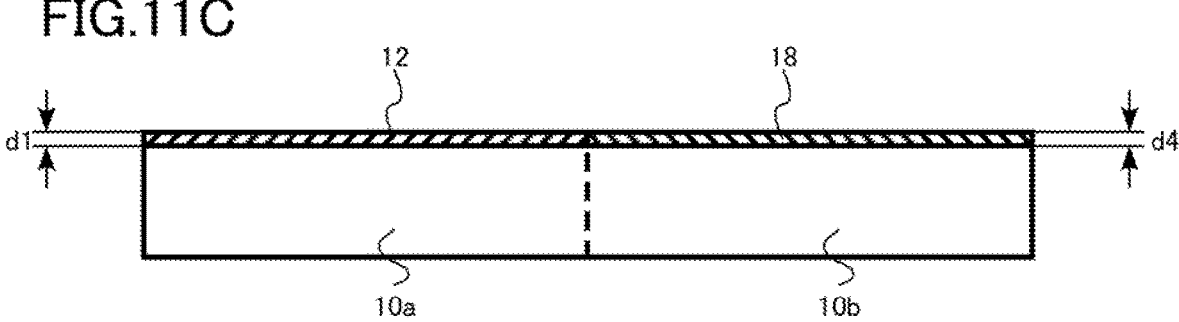
FIG.11C
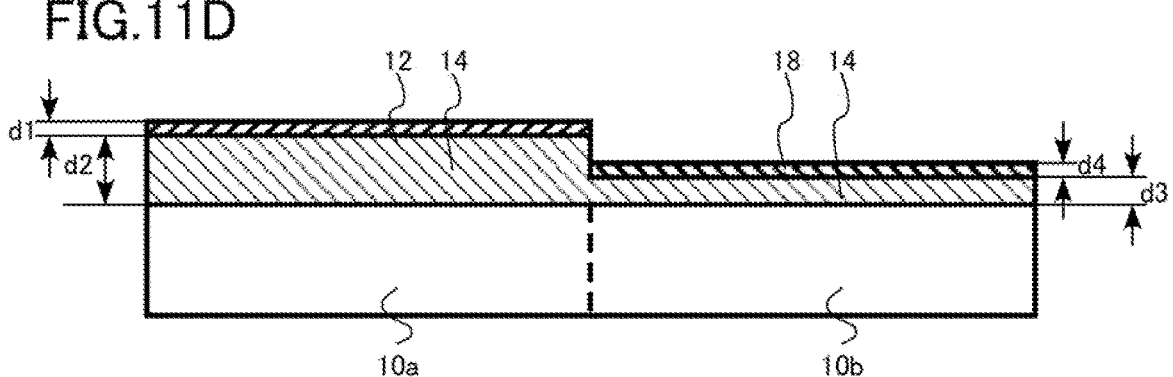
FIG.11D

METHOD FOR MANUFACTURING SEMICONDUCTOR DEVICE

CROSS-REFERENCE TO RELATED APPLICATION

This application is based upon and claims the benefit of priority from Japanese Patent Application No. 2021-131790, filed on Aug. 12, 2021, the entire contents of which are incorporated herein by reference.

FIELD

Embodiments described herein relate generally to a method for manufacturing a semiconductor device.

BACKGROUND

In the manufacture of a semiconductor device, it is desired to achieve a method of forming a thick oxide film by oxidizing a semiconductor layer at a low temperature.

BRIEF DESCRIPTION OF THE DRAWINGS

FIGS. 1A, 1B, and 1C are explanatory diagrams of a method for manufacturing a semiconductor device of a first embodiment;

FIGS. 3A, 3B, and 3C are explanatory diagrams of a method for manufacturing a semiconductor device of a second embodiment;

FIGS. 6A, 6B, 6C, and 6D are explanatory diagrams of the method for manufacturing a semiconductor device of the third embodiment;

FIGS. 7A, 7B, 7C, and 7D are explanatory diagrams of a modified example of the method for manufacturing a semiconductor device of the third embodiment;

FIGS. 9A, 9B, 9C, and 9D are explanatory diagrams of the method for manufacturing a semiconductor device of the fourth embodiment;

FIGS. 11A, 11B, 11C, and 11D are explanatory diagrams of the method for manufacturing a semiconductor device of the fifth embodiment;

DETAILED DESCRIPTION

Figure 2:
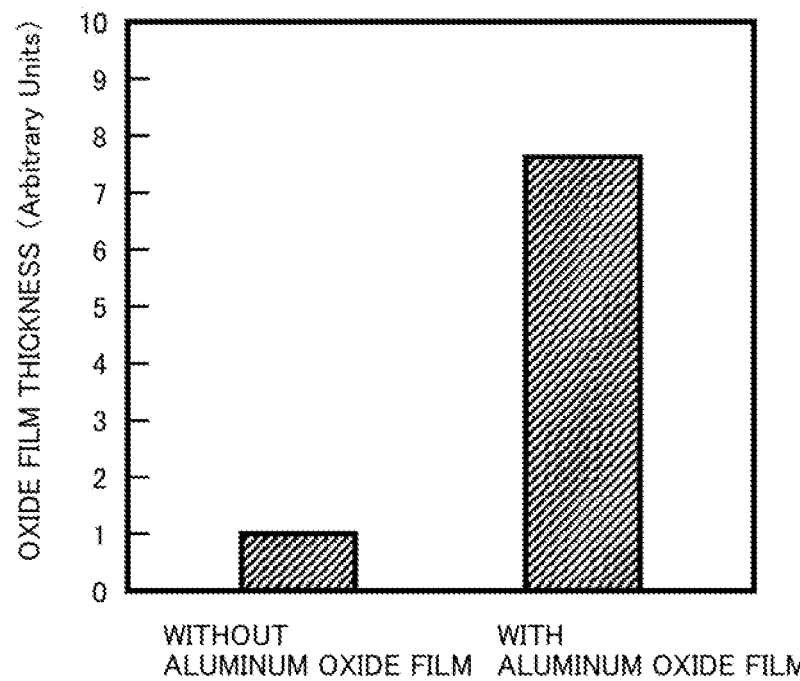
FIG. 2 is an explanatory diagram of functions and effects of the method for manufacturing a semiconductor device of the first embodiment.

A method for manufacturing a semiconductor device according to an embodiment includes: forming a first film on a semiconductor layer containing silicon (Si), the first film containing a metal element and oxygen (O) and having a first thickness; and forming a second film between the semiconductor layer and the first film using radical oxidation, the second film containing silicon (Si) and oxygen (O) and having a second thickness larger than the first thickness.

Hereinafter, embodiments of the present disclosure will be described with reference to the drawings. It should be noted that in the following description, the same or similar members and the like are denoted by the same reference numerals, and the description of the members and the like once described may be appropriately omitted.

In addition, in the present specification, the term "upper" or "lower" may be used for convenience. The term "upper" or "lower" is, for example, a term indicating a relative positional relationship in the drawings. The term "upper" or "lower" does not necessarily define a positional relationship with respect to gravity.

Qualitative analysis and quantitative analysis of the chemical composition of members constituting the semiconductor device in the present specification can be performed by, for example, secondary ion mass spectrometry (SIMS) or energy dispersive X-ray spectroscopy (EDX). In addition, for example, a transmission electron microscope (TEM) can be used to measure the thickness of the members constituting the semiconductor device, the distance between the members, and the like.

First Embodiment

A method for manufacturing a semiconductor device of a first embodiment includes: forming a first film on a semiconductor layer containing silicon (Si), the first film containing a metal element and oxygen (O) and having a first thickness; and forming a second film between the semiconductor layer and the first film using radical oxidation, the second film containing silicon (Si) and oxygen (O) and having a second thickness larger than the first thickness.

FIGS. 1A, 1B, and 1C are explanatory diagrams of the method for manufacturing a semiconductor device of the first embodiment.

First, a semiconductor layer 10 is prepared (FIG. 1A). The semiconductor layer 10 contains silicon (Si). The semiconductor layer 10 contains, for example, silicon (Si) as a main component. The semiconductor layer 10 is, for example, a monocrystalline silicon layer or a polycrystalline silicon layer.

The semiconductor layer 10 is not limited to a monocrystalline silicon layer or a polycrystalline silicon layer. The semiconductor layer 10 may be, for example, a silicon germanide layer or a silicon carbide layer. Hereinafter, a case where the semiconductor layer 10 is a monocrystalline silicon layer will be described as an example.

Next, an aluminum oxide film 12 is formed on the semiconductor layer 10 (FIG. 1B). The aluminum oxide film 12 is an example of the first film. Aluminum (Al) is an example of the metal element.

The aluminum oxide film 12 is formed by, for example, a chemical vapor deposition method (CVD method). The aluminum oxide film 12 is formed by, for example, an atomic layer deposition method (ALD method).

The first film contains a metal element and oxygen (O). The metal element contained in the first film is, for example, at least one metal element selected from the group consisting of aluminum (Al), hafnium (Hf), zirconium (Zr), lanthanum (La), yttrium (Y), titanium (Ti), nickel (Ni), zinc (Zn), indium (In), tin (Sn), gallium (Ga), and tungsten (W). The first film contains, for example, the metal element and oxygen (O) as main components. The first film is, for example, a metal oxide film. The first film is, for example, an oxide film of the metal element.

The first film is, for example, an aluminum oxide film, a hafnium oxide film, a zirconium oxide film, a lanthanum oxide film, an yttrium oxide film, a titanium oxide film, a nickel oxide film, a zinc oxide film, an indium oxide film, a tin oxide film, a gallium oxide film, or a tungsten oxide film.

The first film is, for example, an insulating film or a semiconductor film. The first film is, for example, an amorphous film. The first film contains, for example, at least one element selected from a group consisting of nitrogen (N), carbon (C), hydrogen (H), fluorine (F), and chlorine (Cl).

The first film has a first thickness (d1 in FIGS. 1B and 1C). The first thickness d1 is, for example, equal to or more than 1 nm and equal to or less than 5 nm. The first thickness d1 of the aluminum oxide film 12 is, for example, equal to or more than 1 nm and equal to or less than 5 nm.

The first film is not necessarily limited to the aluminum oxide film. Hereinafter, a case where the first film is an aluminum oxide film will be described as an example.

Next, a silicon oxide film 14 having a second thickness (d2 in FIG. 1C) larger than the first thickness d1 is formed between the semiconductor layer 10 and the aluminum oxide film 12 using radical oxidation (FIG. 1C). The silicon oxide film 14 is formed by oxidizing the semiconductor layer 10 by radical oxidation. The silicon oxide film 14 is an example of the second film.

The radical oxidation is performed in an atmosphere containing oxygen radical or hydroxyl radical. The radical oxidation is performed, for example, in an atmosphere in which oxygen gas, hydrogen gas, and argon gas are converted into plasma. The radical oxidation is performed, for example, in an atmosphere in which water vapor is converted into plasma.

A method for generating oxygen radicals or hydroxyl radicals used for radical oxidation is not particularly limited. The oxygen radical and the hydroxyl radical are generated using, for example, an inductively coupled plasma method, a microwave plasma method, an electron cyclotron resonance method, a helicon wave method, or a hot filament method.

The atmosphere of radical oxidation contains, for example, hydrogen (H) and oxygen (O). The atomic ratio $(H/(H+O))$ of hydrogen (H) contained in the atmosphere of radical oxidation to the sum of hydrogen (H) and oxygen (O) is, for example, equal to or less than 40%. The atomic ratio $(H/(H+O))$ of hydrogen (H) contained in the atmosphere of radical oxidation to the sum of hydrogen (H) and oxygen (O) is, for example, equal to or more than 2% and equal to or less than 5%.

The atomic ratio $(H/(H+O))$ of hydrogen (H) contained in the atmosphere of radical oxidation to the sum of hydrogen (H) and oxygen (O) is adjusted by, for example, the flow rates of hydrogen gas $(H_2)$ and oxygen gas $(O_2)$ introduced into the atmosphere of radical oxidation. The molar ratio $(H_2/(H_2+O_2))$ of the hydrogen gas $(H_2)$ introduced into the atmosphere of radical oxidation to the sum of the hydrogen gas (H) and the oxygen gas $(O_2)$ is, for example, equal to or less than 40%. The molar ratio $(H_2/(H_2+O_2))$ of the hydrogen gas $(H_2)$ introduced into the atmosphere of radical oxidation to the sum of the hydrogen gas $(H_2)$ and the oxygen gas $(O_2)$ is, for example, equal to or more than 2% and equal to or less than 5-.

The temperature of radical oxidation is, for example, equal to or more than 300° C. and equal to or less than 900°

C. The pressure of radical oxidation is, for example, equal to or more than 50 Pa and equal to or less than 3000 Pa.

The second film contains silicon (Si) and oxygen (O). The second film contains, for example, silicon (Si) and oxygen (O) as main components.

The second film has a second thickness (d2 in FIG. 1C). The second thickness d2 is larger than the first thickness d1 of the first film. The second thickness d2 is, for example, 10 times or more the first thickness d1 of the first film. The second thickness d2 is, for example, equal to or more than 10 nm and equal to or less than 300 nm.

The second thickness d2 of the silicon oxide film 14 is larger than the first thickness d1 of the aluminum oxide film 12. The second thickness d2 of the silicon oxide film 14 is, for example, 10 times or more the first thickness d1 of the aluminum oxide film 12. The second thickness d2 of the silicon oxide film 14 is, for example, equal to or more than 10 nm and equal to or less than 300 nm.

Next, functions and effects of the method for manufacturing a semiconductor device of the first embodiment will be described.

In the manufacture of a semiconductor device, it is desired to achieve a method of forming a thick oxide film by oxidizing a semiconductor layer at a low temperature. For example, by oxidizing the semiconductor layer at a low temperature, degradation of characteristics of a device formed in the semiconductor layer can be suppressed.

For example, in the manufacture of a semiconductor device including a transistor, when a high-temperature heat treatment is applied after the transistor is formed, characteristics of the transistor may be degraded. The degradation may be caused by diffusion of impurities due to the heat treatment, or change of a material constituting the transistor due to the heat treatment. If the oxide film can be formed at a low temperature after the transistor is formed, degradation of characteristics of the transistor can be suppressed.

In the method for manufacturing a semiconductor device of the first embodiment, radical oxidation is used for oxidation of the semiconductor layer. Using radical oxidation allows the semiconductor layer to be oxidized at a lower temperature than using thermal oxidation, for example.

FIG. 2 is an explanatory diagram of functions and effects of the method for manufacturing a semiconductor device of the first embodiment. FIG. 2 is a diagram showing a film thickness of an oxide film formed by oxidizing a semiconductor layer by radical oxidation.

FIG. 2 is a diagram for comparing the oxide film thicknesses when the second film is formed on the semiconductor layer and when the second film is not formed. FIG. 2 shows a case where the semiconductor layer is a monocrystalline silicon layer and the second film is an aluminum oxide film. FIG. 2 shows a case where the film thickness of the aluminum oxide film is 3 nm and the temperature of radical oxidation is 700° C.

As is apparent from FIG. 2, it can be seen that when the aluminum oxide film 12 is formed on the semiconductor layer 10 and radical oxidation is performed, the oxide film thickness is seven times or more as compared with when the aluminum oxide film 12 is not formed. In other words, it can be seen that large enhanced oxidation occurs by forming the aluminum oxide film 12 on the semiconductor layer 10 and performing radical oxidation.

The mechanism in which large enhanced oxidation as shown in FIG. 2 occurs is not necessarily clear. However, it is considered that the presence of a film in which a metal element and oxygen (O) coexist on the semiconductor layer 10 containing silicon reduces the activation energy for oxide film formation and causes enhanced oxidation. In addition, it is considered that oxygen defects in the metal oxide are filled with oxygen radicals or hydroxyl radicals, and then oxygen in the metal oxide is discharged by the oxygen radicals or hydroxyl radicals that have entered the metal oxide, and enhanced oxidation occurs.

In the method for manufacturing a semiconductor device of the first embodiment, the first film is preferably amorphous. Since the first film is amorphous, the degree of enhanced oxidation increases.

In the method for manufacturing a semiconductor device of the first embodiment, the first thickness d1 of the first film is preferably equal to or more than 0.5 nm, and more preferably equal to or more than 1 nm. When the first thickness d1 is equal to or more than 0.5 nm, the degree of enhanced oxidation increases, and when the first thickness d1 is equal to or more than 1 nm, the degree of enhanced oxidation further increases.

In addition, in the method for manufacturing a semiconductor device of the first embodiment, the first thickness d1 of the first film is preferably equal to or less than 5 nm, and more preferably equal to or less than 3 nm. When the first thickness d1 is equal to or less than 5 nm, the degree of enhanced oxidation increases. In addition, when the first thickness d1 is equal to or less than 3 nm, the degree of enhanced oxidation further increases.

In the method for manufacturing a semiconductor device of the first embodiment, the temperature of radical oxidation is preferably equal to or more than 300° C., more preferably equal to or more than 400° C., and still more preferably equal to or more than 500° C. Increase in the temperature of radical oxidation increases the degree of enhanced oxidation.

In the method for manufacturing a semiconductor device of the first embodiment, the temperature of radical oxidation is preferably equal to or less than 900° C., more preferably equal to or less than 800° C., and still more preferably equal to or less than 700° C. Decrease in the temperature of radical oxidation can suppress degradation of characteristics of a device formed on a semiconductor layer, for example.

In the method for manufacturing a semiconductor device of the first embodiment, the first film preferably contains at least one element selected from a group consisting of nitrogen (N), carbon (C), hydrogen (H), and chlorine (Cl). Since the first film contains the above elements, crystallization of the first film is suppressed, and the degree of enhanced oxidation increases.

In the method for manufacturing a semiconductor device of the first embodiment, hydrogen (H) and oxygen (O) are contained in the atmosphere of radical oxidation, and the atomic ratio of the contained hydrogen (H) to the sum of hydrogen (H) and oxygen (O) (H/(H+O)) is preferably equal to or less than 40%, and more preferably equal to or more than 2% and equal to or less than 5%. When the atomic ratio (H/(H+O)) satisfies the above range, the degree of enhanced oxidation increases.

As described above, according to the method for manufacturing a semiconductor device of the first embodiment, it is possible to oxidize the semiconductor layer at a low temperature to form a thick oxide film.

Second Embodiment

A method for manufacturing a semiconductor device of a second embodiment is different from the method for manufacturing a semiconductor device of the first embodiment in forming a third film containing silicon (Si), oxygen (O), and nitrogen (N) on the semiconductor layer before forming the first film on the semiconductor layer. Hereinafter, description of contents overlapping with those of the first embodiment may be partially omitted.

FIGS. 3A, 3B, and 3C are explanatory diagrams of the method for manufacturing a semiconductor device of the second embodiment.

First, a semiconductor layer 10 is prepared (FIG. 3A). The semiconductor layer 10 contains silicon (Si). The semiconductor layer 10 contains, for example, silicon (Si) as a main component. The semiconductor layer 10 is, for example, a monocrystalline silicon layer or a polycrystalline silicon layer.

Next, a silicon oxynitride film 16 is formed on the semiconductor layer 10. The silicon oxynitride film 16 is an example of a third film.

The silicon oxynitride film 16 is formed by, for example, a CVD method. The silicon oxynitride film 16 is formed by, for example, an ALD method.

The third film contains silicon (Si), oxygen (O), and nitrogen (N). The third film contains, for example, silicon (Si), oxygen (O), and nitrogen (N) as main components.

The thickness of the third film is, for example, equal to or more than 1 nm and equal to or less than 10 nm. The thickness of the silicon oxynitride film 16 is, for example, equal to or more than 1 nm and equal to or less than 10 nm.

Next, an aluminum oxide film 12 is formed on the semiconductor layer 10 (FIG. 3B). The aluminum oxide film 12 is an example of the first film.

The first film contains a metal element and oxygen (O). The metal element contained in the first film is, for example, at least one metal element selected from the group consisting of aluminum (Al), hafnium (Hf), zirconium (Zr), lanthanum (La), yttrium (Y), titanium (Ti), nickel (Ni), zinc (Zn), indium (In), tin (Sn), gallium (Ga), and tungsten (W). The first film contains, for example, the metal element and oxygen (O) as main components. The first film is, for example, a metal oxide film.

The first film has a first thickness (d1 in FIGS. 3B and 3C). The first thickness d1 is, for example, equal to or more than 1 nm and equal to or less than 5 nm. The first thickness d1 of the aluminum oxide film 12 is, for example, equal to or more than 1 nm and equal to or less than 5 nm.

Next, a silicon oxide film 14 having a second thickness (d2 in FIG. 3C) larger than the first thickness d1 is formed between the semiconductor layer 10 and the aluminum oxide film 12 using radical oxidation (FIG. 3C).

The silicon oxide film 14 is formed between the semiconductor layer 10 and the silicon oxynitride film 16.

The silicon oxide film 14 is formed by oxidizing the semiconductor layer 10 by radical oxidation. The silicon oxide film 14 is an example of the second film.

The second film contains silicon (Si) and oxygen (O). The second film contains, for example, silicon (Si) and oxygen (O) as main components.

The second film has a second thickness (d2 in FIG. 3C). The second thickness d2 is larger than the first thickness d1 of the first film. The second thickness d2 is, for example, 10 times or more the first thickness d1 of the first film. The second thickness d2 is, for example, equal to or more than 10 nm and equal to or less than 600 nm. The second thickness d2 is larger than the thickness of the third film.

The second thickness d2 of the silicon oxide film 14 is larger than the first thickness d1 of the aluminum oxide film 12. The second thickness d2 of the silicon oxide film 14 is, for example, 10 times or more the first thickness d1 of the aluminum oxide film 12. The second thickness d2 of the silicon oxide film 14 is, for example, equal to or more than 10 nm and equal to or less than 600 nm. The second thickness d2 is larger than the thickness of the silicon oxynitride film 16.

Next, functions and effects of the method for manufacturing a semiconductor device of the second embodiment will be described.

Figure 4:
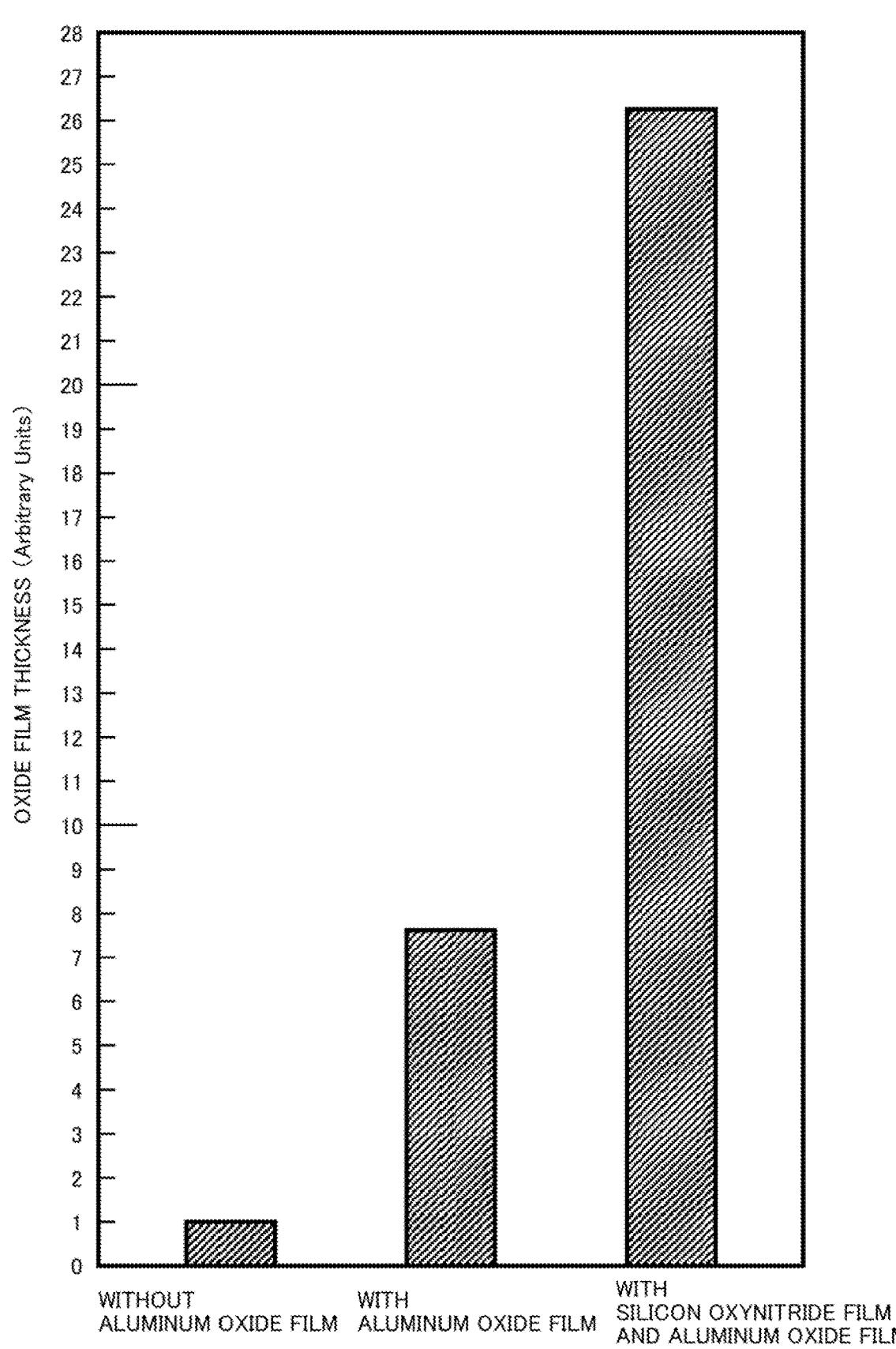
FIG. 4 is an explanatory diagram of functions and effects of the method for manufacturing a semiconductor device of the second embodiment.

FIG. 4 is an explanatory diagram of functions and effects of the method for manufacturing a semiconductor device of the second embodiment. FIG. 4 is a diagram showing a film thickness of an oxide film formed by oxidizing a semiconductor layer by radical oxidation.

FIG. 4 is a diagram for comparing oxide film thicknesses when the third film and the second film are formed on the semiconductor layer, when only the second film is formed, and when neither the third film nor the second film is formed. FIG. 4 shows a case where the semiconductor layer is a monocrystalline silicon layer, the third film is a silicon oxynitride film, and the second film is an aluminum oxide film. FIG. 4 shows a case where the film thickness of the silicon oxynitride film is 8 nm, the film thickness of the aluminum oxide film is 3 nm, and the temperature of radical oxidation is 700° C.

As is apparent from FIG. 4, it can be seen that when the silicon oxynitride film 16 and the aluminum oxide film 12 are formed on the semiconductor layer 10 and radical oxidation is performed, the oxide film thickness is 26 times or more as compared with when neither the silicon oxynitride film 16 nor the aluminum oxide film 12 is formed. In addition, it can be seen that when the silicon oxynitride film 16 and the aluminum oxide film 12 are formed on the semiconductor layer 10 and radical oxidation is performed, the oxide film thickness is three times or more as compared with when only the aluminum oxide film 12 is formed and radical oxidation is performed. It can be seen that forming the silicon oxynitride film 16 and the aluminum oxide film 12 on the semiconductor layer 10 and performing radical oxidation causes significantly large enhanced oxidation.

As described above, according to the method for manufacturing a semiconductor device of the second embodiment, it is possible to oxidize the semiconductor layer at a low temperature to form a thick oxide film.

Third Embodiment

A method for manufacturing a semiconductor device of a third embodiment includes: forming a first film on at least a first region of a semiconductor layer containing silicon (Si) and including the first region and a second region, the first film containing a first metal element and oxygen (O), and the first film having a first thickness; and forming a second film between the first region and the first film and on the second region using radical oxidation, the second film containing silicon (Si) and oxygen (O), a second thickness on the first region being larger than the first thickness, and a third thickness on the second region being smaller than the second thickness. The first film is selectively formed on the first region. Hereinafter, description of contents overlapping with those of the first embodiment may be partially omitted.

Figure 5:
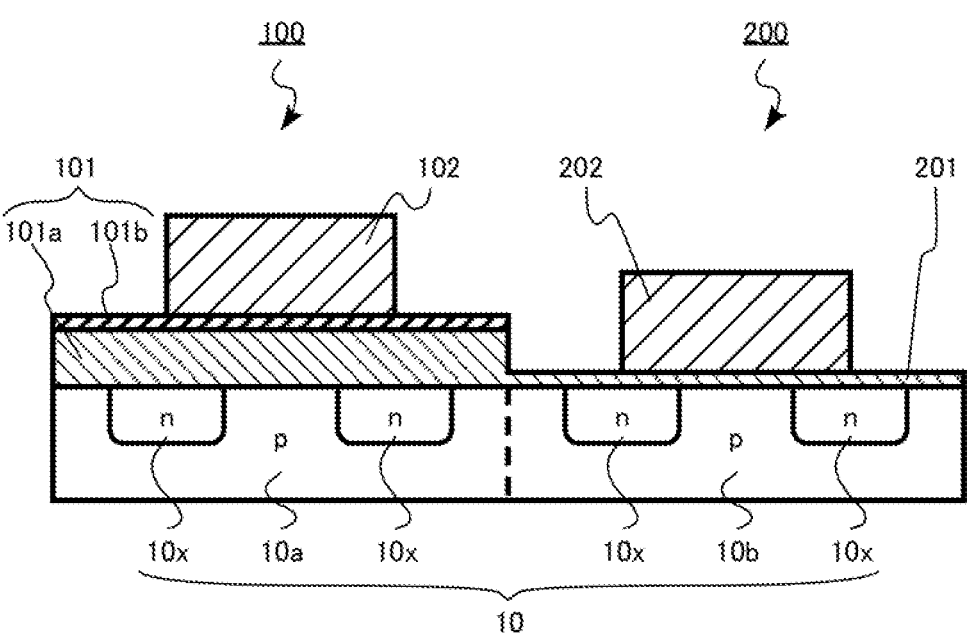
FIG. 5 is a schematic cross-sectional view of a semiconductor device manufactured by a method for manufacturing a semiconductor device of a third embodiment.

FIG. 5 is a schematic cross-sectional view of a semiconductor device manufactured by a method for manufacturing a semiconductor device of a third embodiment. The semiconductor device includes a first transistor 100 and a second transistor 200. The first transistor 100 and the second transistor 200 are metal oxide field effect transistors (MOSFET).

The first transistor 100 includes a semiconductor layer 10, a first gate insulating layer 101, and a first gate electrode 102. The semiconductor layer 10 includes a first p-type semiconductor region 10a and an n-type semiconductor region 10x. The first gate insulating layer 101 includes a first lower part film 101a and a first upper part film 101b.

The semiconductor layer 10 is, for example, a monocrystalline silicon layer. A portion opposite to the first gate electrode 102 of the first p-type semiconductor region 10a functions as a channel region of the first transistor 100. The n-type semiconductor region 10x functions as a source/drain region of the first transistor 100.

The first lower part film 101a of the first gate insulating layer 101 contains silicon (Si) and oxygen (O). The first lower part film 101a is, for example, a silicon oxide film. The first upper part film 101b of the first gate insulating layer 101 contains a first metal element and oxygen (O). The first upper part film 101b is, for example, an aluminum oxide film. Aluminum (Al) is an example of the first metal element.

The first gate electrode 102 is a conductor. The first gate electrode 102 is, for example, polycrystalline silicon containing p-type impurities or n-type impurities.

The second transistor 200 includes a semiconductor layer 10, a second gate insulating layer 201, and a second gate electrode 202. The semiconductor layer 10 includes a second p-type semiconductor region 10b and an n-type semiconductor region 10x.

A portion opposite to the second gate electrode 202 of the second p-type semiconductor region 10b functions as a channel region of the second transistor 200. The n-type semiconductor region 10x functions as a source/drain region of the second transistor 200.

The second gate insulating layer 201 contains silicon (Si) and oxygen (O). The second gate insulating layer 201 is, for example, a silicon oxide film.

The second gate electrode 202 is a conductor. The second gate electrode 202 is, for example, polycrystalline silicon containing p-type impurities or n-type impurities.

The thickness of the first gate insulating layer 101 of the first transistor 100 is larger than the thickness of the second gate insulating layer 201 of the second transistor 200.

Since the first gate insulating layer 101 of the first transistor 100 is larger than the second gate insulating layer 201 of the second transistor 200, for example, the first transistor 100 can be operated at a higher drive voltage than the second transistor 200.

FIGS. 6A, 6B, 6C, and 6D are explanatory diagrams of the method for manufacturing a semiconductor device of the third embodiment.

First, a semiconductor layer 10 is prepared (FIG. 6A). The semiconductor layer 10 contains silicon (Si). The semiconductor layer 10 contains, for example, silicon (Si) as a main component. The semiconductor layer 10 is, for example, a monocrystalline silicon layer or a polycrystalline silicon layer.

The semiconductor layer 10 is not limited to a monocrystalline silicon layer or a polycrystalline silicon layer. The semiconductor layer 10 may be, for example, a silicon germanide layer or a silicon carbide layer. Hereinafter, a case where the semiconductor layer 10 is a monocrystalline silicon layer will be described as an example.

The semiconductor layer 10 includes a first p-type semiconductor region 10a and a second p-type semiconductor region 10b.

Next, an aluminum oxide film 12 is formed on the semiconductor layer 10 (FIG. 6B). The aluminum oxide film 12 is an example of the first film. A part of the aluminum oxide film 12 finally becomes the first upper part film 101$b$. Aluminum (Al) is an example of the first metal element.

The aluminum oxide film 12 is formed by, for example, a CVD method. The aluminum oxide film 12 is formed by, for example, an ALD method.

The first film contains a first metal element and oxygen (O). The first metal element contained in the first film is, for example, at least one metal element selected from the group consisting of aluminum (Al), hafnium (Hf), zirconium (Zr), lanthanum (La), yttrium (Y), titanium (Ti), nickel (Ni), zinc (Zn), indium (In), tin (Sn), gallium (Ga), and tungsten (W). The first film contains, for example, the first metal element and oxygen (O) as main components. The first film is, for example, a metal oxide film. The first film is, for example, an oxide film of the first metal element.

The first film is, for example, an insulating film or a semiconductor film. The first film is, for example, an amorphous film. The first film contains, for example, at least one element selected from a group consisting of nitrogen (N), carbon (C), hydrogen (H), and chlorine (Cl).

The first film has a first thickness (d1 in FIG. 6B). The first thickness d1 is, for example, equal to or more than 1 nm and equal to or less than 5 nm. The first thickness d1 of the aluminum oxide film 12 is, for example, equal to or more than 1 nm and equal to or less than 5 nm.

The first film is not necessarily limited to the aluminum oxide film. Hereinafter, a case where the first film is an aluminum oxide film will be described as an example.

Next, the aluminum oxide film 12 on the second p-type semiconductor region 10$b$ is removed (FIG. 6C). The aluminum oxide film 12 on the second p-type semiconductor region 10$b$ is removed using, for example, a wet etching method. By removing the aluminum oxide film 12 on the second p-type semiconductor region 10$b$, the aluminum oxide film 12 is selectively formed on the first p-type semiconductor region 10$a$.

Next, a silicon oxide film 14 is formed on the semiconductor layer 10 by radical oxidation (FIG. 6D). The silicon oxide film 14 is formed on the first p-type semiconductor region 10$a$. The silicon oxide film 14 is formed between the first p-type semiconductor region 10$a$ and the aluminum oxide film 12. The silicon oxide film 14 is formed on the second p-type semiconductor region 10$b$.

The silicon oxide film 14 on the first p-type semiconductor region 10$a$ finally becomes the first lower part film 101$a$. In addition, the silicon oxide film 14 on the second p-type semiconductor region 10$b$ finally becomes the second gate insulating layer 201.

The second thickness (d2 in FIG. 6D) of the silicon oxide film 14 between the first p-type semiconductor region 10$a$ and the aluminum oxide film 12 is larger than the first thickness d1 of the aluminum oxide film 12. The third thickness (d3 in FIG. 6D) of the silicon oxide film 14 on the second p-type semiconductor region 10$b$ is smaller than the second thickness d2 of the silicon oxide film 14.

The silicon oxide film 14 is formed by oxidizing the semiconductor layer 10 by radical oxidation. The silicon oxide film 14 is an example of the second film.

The silicon oxide film 14 on the first p-type semiconductor region 10$a$ is thicker than the silicon oxide film 14 on the second p-type semiconductor region 10$b$ due to enhanced oxidation.

The radical oxidation is performed in an atmosphere containing oxygen radical or hydroxyl radical. The radical oxidation is performed, for example, in an atmosphere in which oxygen gas, hydrogen gas, and argon gas are converted into plasma. The radical oxidation is performed, for example, in an atmosphere in which water vapor is converted into plasma.

A method for generating oxygen radicals or hydroxyl radicals used for radical oxidation is not particularly limited. The oxygen radical and the hydroxyl radical are generated using, for example, an inductively coupled plasma method, a microwave plasma method, an electron cyclotron resonance method, a helicon wave method, or a hot filament method.

The atmosphere of radical oxidation contains, for example, hydrogen (H) and oxygen (O). The atomic ratio (H/(H+O)) of hydrogen (H) contained in the atmosphere of radical oxidation to the sum of hydrogen (H) and oxygen (O) is, for example, equal to or less than 40%. The atomic ratio (H/(H+O)) of hydrogen (H) contained in the atmosphere of radical oxidation to the sum of hydrogen (H) and oxygen (O) is, for example, equal to or more than 2% and equal to or less than 5%.

The atomic ratio (H/(H+O)) of hydrogen (H) contained in the atmosphere of radical oxidation to the sum of hydrogen (H) and oxygen (O) is adjusted by, for example, the flow rates of hydrogen gas ($H_2$) and oxygen gas ($O_2$) introduced into the atmosphere of radical oxidation. The molar ratio ($H_2/(H_2+O_2)$) of the hydrogen gas ($H_2$) introduced into the atmosphere of radical oxidation to the sum of the hydrogen gas ($H_2$) and the oxygen gas ($O_2$) is, for example, equal to or less than 40%. The molar ratio ($H_2/(H_2+O_2)$) of the hydrogen gas ($H_2$) introduced into the atmosphere of radical oxidation to the sum of the hydrogen gas ($H_2$) and the oxygen gas ($O_2$) is, for example, equal to or more than 2% and equal to or less than 5%.

The temperature of radical oxidation is, for example, equal to or more than 300° C. and equal to or less than 900° C. The pressure of radical oxidation is, for example, equal to or more than 50 Pa and equal to or less than 3000 Pa.

The second film contains silicon (Si) and oxygen (O). The second film contains, for example, silicon (Si) and oxygen (O) as main components.

The second film on the first p-type semiconductor region 10$a$ has a second thickness (d2 in FIG. 6D). The second film on the second p-type semiconductor region 10$b$ has a third thickness (d3 in FIG. 6D).

The second thickness d2 is larger than the first thickness d1 of the first film. The second thickness d2 is, for example, 10 times or more the first thickness d1 of the first film. The second thickness d2 is, for example, equal to or more than 10 nm and equal to or less than 300 nm.

The second thickness d2 of the silicon oxide film 14 is larger than the first thickness d1 of the aluminum oxide film 12. The second thickness d2 of the silicon oxide film 14 is, for example, 10 times or more the first thickness d1 of the aluminum oxide film 12. The second thickness d2 of the silicon oxide film 14 is, for example, equal to or more than 10 nm and equal to or less than 300 nm.

The second thickness d2 is larger than the third thickness d3. The second thickness d2 is, for example, seven times or more the third thickness d3.

The second thickness d2 of the silicon oxide film 14 is larger than the third thickness d3 of the silicon oxide film 14. The second thickness d2 of the silicon oxide film 14 is, for example, seven times or more the third thickness d3 of the silicon oxide film 14.

Thereafter, the semiconductor device shown in FIG. 5 can be manufactured by forming the first gate electrode 102, the second gate electrode 202, and the n-type semiconductor region 10$x$ using a known process technique. The first gate electrode 102 is formed above the silicon oxide film 14 on the first p-type semiconductor region 10*a*. The second gate electrode 202 is formed above the silicon oxide film 14 on the second p-type semiconductor region 10*b*.

Modified Example

A modified example of the method for manufacturing a semiconductor device of the third embodiment is different from the method for manufacturing a semiconductor device of the third embodiment in forming a third film containing silicon (Si), oxygen (O), and nitrogen (N) on the first region before forming the first film.

FIGS. 7A, 7B, 7C, and 7D are explanatory diagrams of the modified example of the method for manufacturing a semiconductor device of the third embodiment.

First, a semiconductor layer 10 is prepared (FIG. 7A). The semiconductor layer 10 includes a first p-type semiconductor region 10*a* and a second p-type semiconductor region 10*b*.

Next, a silicon oxynitride film 16 is formed on the semiconductor layer 10. The silicon oxynitride film 16 is an example of a third film. Next, an aluminum oxide film 12 is formed on the semiconductor layer 10 (FIG. 7B). The aluminum oxide film 12 is an example of the first film.

Next, the silicon oxynitride film 16 and the aluminum oxide film 12 on the second p-type semiconductor region 10*b* are removed (FIG. 7C). The silicon oxynitride film 16 and the aluminum oxide film 12 on the second p-type semiconductor region 10*b* are removed using, for example, a wet etching method. By removing the silicon oxynitride film 16 and the aluminum oxide film 12 on the second p-type semiconductor region 10*b*, the silicon oxynitride film 16 and the aluminum oxide film 12 are selectively formed on the first p-type semiconductor region 10*a*.

Next, a silicon oxide film 14 is formed on the semiconductor layer 10 by radical oxidation (FIG. 7D). The silicon oxide film 14 is formed on the first p-type semiconductor region 10*a*. The silicon oxide film 14 is formed on the second p-type semiconductor region 10*b*.

The silicon oxide film 14 is formed by oxidizing the semiconductor layer 10 by radical oxidation. The silicon oxide film 14 is an example of the second film.

The silicon oxide film 14 on the first p-type semiconductor region 10*a* is thicker than the silicon oxide film 14 on the second p-type semiconductor region 10*b* due to enhanced oxidation. In particular, by providing the silicon oxynitride film 16 on the first p-type semiconductor region 10*a*, enhanced oxidation is promoted as compared with that in the method for manufacturing a semiconductor device of the third embodiment. Therefore, as compared with that in the method for manufacturing a semiconductor device of the third embodiment, it is easy to make the second thickness (d2 in FIG. 7B) of the silicon oxide film 14 on the first p-type semiconductor region 10*a* larger than the third thickness (d3 in FIG. 7B) of the silicon oxide film 14 on the second p-type semiconductor region 10*b*.

Thereafter, by forming the first gate electrode 102, the second gate electrode 202, and the n-type semiconductor region 10*x* using a known process technique, a semiconductor device similar to that shown in FIG. 5 can be manufactured.

As described above, according to the method for manufacturing a semiconductor device of the third embodiment, and the modified example of it, it is possible to oxidize the semiconductor layer at a low temperature to form oxide films having different thicknesses on the semiconductor layer.

Fourth Embodiment

In a method for manufacturing a semiconductor device of a fourth embodiment, a third film containing silicon (Si), oxygen (O), and nitrogen (N) is formed on the first region before the first film is formed. Hereinafter, description of contents overlapping with those of the third embodiment may be partially omitted.

Figure 8:
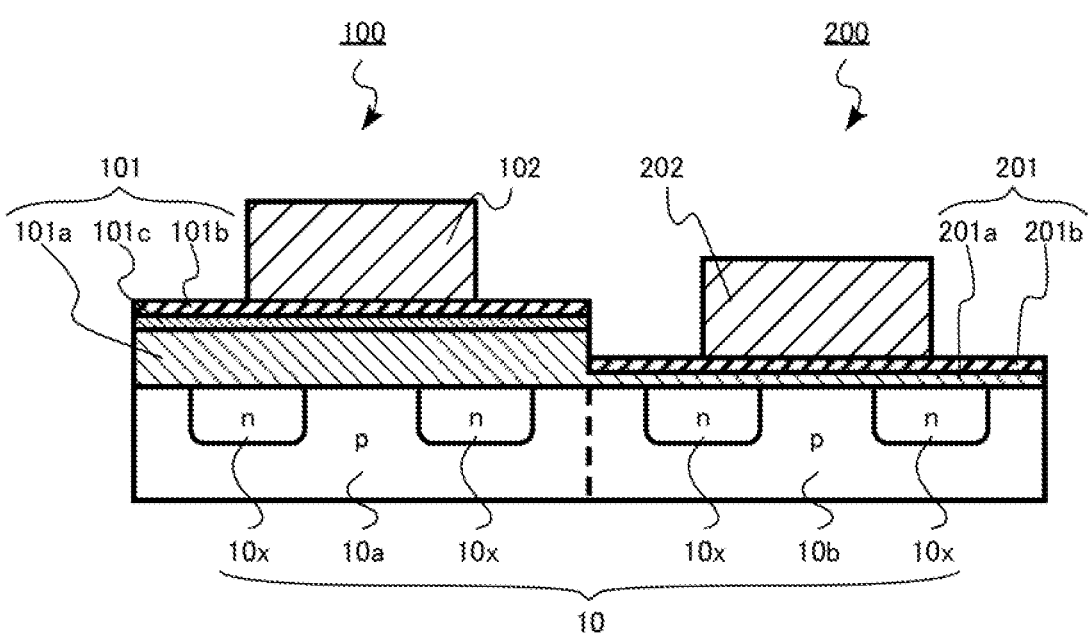
FIG. 8 is a schematic cross-sectional view of a semiconductor device manufactured by a method for manufacturing a semiconductor device of a fourth embodiment.

FIG. 8 is a schematic cross-sectional view of a semiconductor device manufactured by the method for manufacturing a semiconductor device of the fourth embodiment. The semiconductor device includes a first transistor 100 and a second transistor 200. The first transistor 100 and the second transistor 200 are MOSFETs.

The first transistor 100 includes a semiconductor layer 10, a first gate insulating layer 101, and a first gate electrode 102. The semiconductor layer 10 includes a first p-type semiconductor region 10*a* and an n-type semiconductor region 10*x*. The first gate insulating layer 101 includes a first lower part film 101*a*, an intermediate film 101*c*, and a first upper part film 101*b*.

A first transistor 100 of the fourth embodiment is different from the first transistor 100 of the third embodiment in that the first gate insulating layer 101 includes the intermediate film 101*c*.

The first lower part film 101*a* of the first gate insulating layer 101 contains silicon (Si) and oxygen (O). The first lower part film 101*a* is, for example, a silicon oxide film. The intermediate film 101*c* of the first gate insulating layer 101 contains silicon (Si), oxygen (O), and nitrogen (N). The intermediate film 101*c* is, for example, a silicon oxynitride film. The first upper part film 101*b* of the first gate insulating layer 101 contains a first metal element and oxygen (O). The first upper part film 101*b* is, for example, an aluminum oxide film.

The second transistor 200 includes a semiconductor layer 10, a second gate insulating layer 201, and a second gate electrode 202. The semiconductor layer 10 includes a second p-type semiconductor region 10*b* and an n-type semiconductor region 10*x*. The second gate insulating layer 201 includes a second lower part film 201*a* and a second upper part film 201*b*.

The second gate insulating layer 201 contains silicon (Si) and oxygen (O). The second lower part film 201*a* of the second gate insulating layer 201 is, for example, a silicon oxide film. The second upper part film 201*b* of the second gate insulating layer 201 contains a first metal element and oxygen (O). The second upper part film 201*b* is, for example, an aluminum oxide film.

The thickness of the first gate insulating layer 101 of the first transistor 100 is larger than the thickness of the second gate insulating layer 201 of the second transistor 200.

FIGS. 9A, 9B, 9C, and 9D are explanatory diagrams of the method for manufacturing a semiconductor device of the fourth embodiment.

First, a semiconductor layer 10 is prepared (FIG. 9A). The semiconductor layer 10 includes a first p-type semiconductor region 10*a* and a second p-type semiconductor region 10*b*.

Next, a silicon oxynitride film 16 is formed on the semiconductor layer 10. The silicon oxynitride film 16 is an example of a third film. Next, the silicon oxynitride film 16 on the second p-type semiconductor region 10*b* is removed (FIG. 9B). The silicon oxynitride film 16 is selectively formed on the first p-type semiconductor region 10*a*. The silicon oxynitride film 16 finally becomes the intermediate film 101*c*.

Next, an aluminum oxide film 12 is formed on the semiconductor layer 10 (FIG. 9C). The aluminum oxide film 12 is an example of the first film. A part of the aluminum oxide film 12 finally becomes the first upper part film 101*b*. Another part of the aluminum oxide film 12 finally becomes the second upper part film 201*b*.

Next, a silicon oxide film 14 is formed on the semiconductor layer 10 by radical oxidation (FIG. 9D). The silicon oxide film 14 is formed on the first p-type semiconductor region 10*a*. The silicon oxide film 14 is formed on the second p-type semiconductor region 10*b*.

The silicon oxide film 14 on the first p-type semiconductor region 10*a* finally becomes the first lower part film 101*a*. In addition, the silicon oxide film 14 on the second p-type semiconductor region 10*b* finally becomes the second lower part film 201*a*.

The second thickness (d2 in FIG. 9D) of the silicon oxide film 14 between the first p-type semiconductor region 10*a* and the aluminum oxide film 12 is larger than the first thickness (d1 in FIGS. 9C and 9D) of the aluminum oxide film 12. The third thickness (d3 in FIG. 9D) of the silicon oxide film 14 on the second p-type semiconductor region 10*b* is smaller than the second thickness d2 of the silicon oxide film 14.

The silicon oxide film 14 is formed by oxidizing the semiconductor layer 10 by radical oxidation. The silicon oxide film 14 is an example of the second film.

The silicon oxide film 14 on the first p-type semiconductor region 10*a* is thicker than the silicon oxide film 14 on the second p-type semiconductor region 10*b* due to enhanced oxidation.

Thereafter, the semiconductor device shown in FIG. 8 can be manufactured by forming the first gate electrode 102, the second gate electrode 202, and the n-type semiconductor region 10*x* using a known process technique.

As described above, according to the method for manufacturing a semiconductor device of the fourth embodiment, it is possible to oxidize the semiconductor layer at a low temperature to form oxide films having different thicknesses on the semiconductor layer.

Fifth Embodiment

A method for manufacturing a semiconductor device of a fifth embodiment is different from the method for manufacturing a semiconductor device of the third embodiment in that a fourth film is formed on the second region, before the first film is formed, or after the first film is formed and before the second film is formed, the fourth film containing a second metal element different from the first metal element and oxygen (O) and having a fourth thickness, and the third thickness is larger than the fourth thickness. Hereinafter, description of contents overlapping with those of the third embodiment may be partially omitted.

Figure 10:
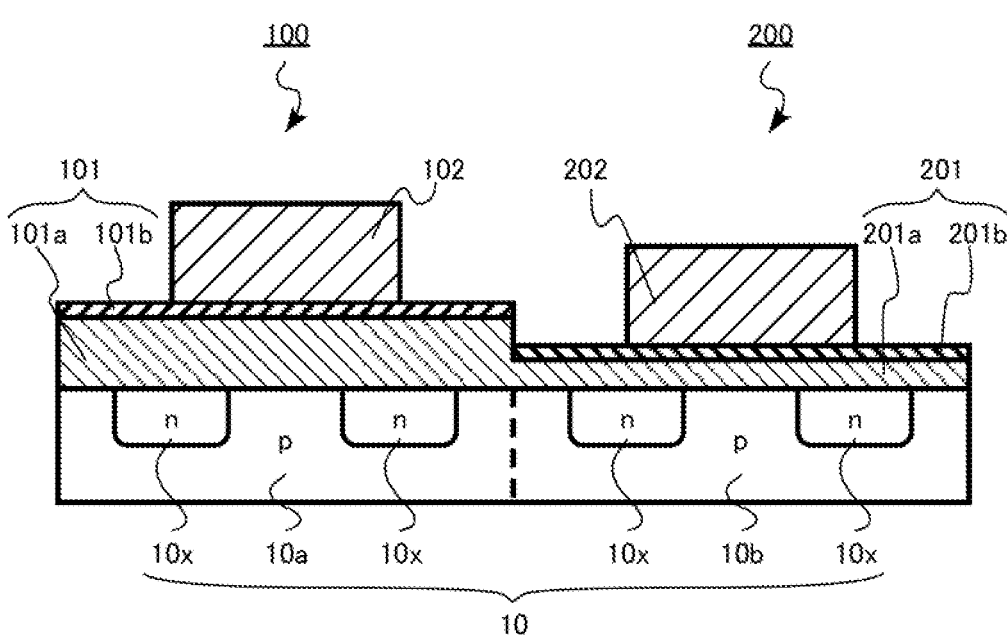
FIG. 10 is a schematic cross-sectional view of a semiconductor device manufactured by a method for manufacturing a semiconductor device of a fifth embodiment.

FIG. 10 is a schematic cross-sectional view of a semiconductor device manufactured by the method for manufacturing a semiconductor device of the fifth embodiment. The semiconductor device includes a first transistor 100 and a second transistor 200. The first transistor 100 and the second transistor 200 are MOSFETs.

The first transistor 100 includes a semiconductor layer 10, a first gate insulating layer 101, and a first gate electrode 102. The semiconductor layer 10 includes a first p-type semiconductor region 10*a* and an n-type semiconductor region 10*x*. The first gate insulating layer 101 includes a first lower part film 101*a* and a first upper part film 101*b*.

The first lower part film 101*a* of the first gate insulating layer 101 contains silicon (Si) and oxygen (O). The first lower part film 101*a* is, for example, a silicon oxide film. The first lower part film 101*a* is, for example, a silicon oxide film. The first upper part film 101*b* of the first gate insulating layer 101 contains a first metal element and oxygen (O). The first upper part film 101*b* is, for example, an aluminum oxide film. Aluminum (Al) is an example of the first metal element.

The second transistor 200 includes a semiconductor layer 10, a second gate insulating layer 201, and a second gate electrode 202. The semiconductor layer 10 includes a second p-type semiconductor region 10*b* and an n-type semiconductor region 10*x*. The second gate insulating layer 201 includes a second lower part film 201*a* and a second upper part film 201*b*.

The second transistor 200 of the fifth embodiment is different from the second transistor 200 of the third embodiment in that the second gate insulating layer 201 includes the second lower part film 201*a* and the second upper part film 201*b*.

The second gate insulating layer 201 contains silicon (Si) and oxygen (O). The second lower part film 201*a* of the second gate insulating layer 201 is, for example, a silicon oxide film. The second upper part film 201*b* of the second gate insulating layer 201 contains a second metal element different from the first metal element and oxygen (O). The second upper part film 201*b* is, for example, a hafnium oxide film. Hafnium (Hf) is an example of the second metal element.

The thickness of the first gate insulating layer 101 of the first transistor 100 is larger than the thickness of the second gate insulating layer 201 of the second transistor 200.

FIGS. 11A, 11B, 11C, and 11D are explanatory diagrams of the method for manufacturing a semiconductor device of the fifth embodiment.

First, a semiconductor layer 10 is prepared (FIG. 11A). The semiconductor layer 10 includes a first p-type semiconductor region 10*a* and a second p-type semiconductor region 10*b*.

Next, an aluminum oxide film 12 is formed on the first p-type semiconductor region 10*a* of the semiconductor layer 10 (FIG. 11B). The aluminum oxide film 12 is an example of the first film. The aluminum oxide film 12 finally becomes the first upper part film 101*b*. Aluminum (Al) is an example of the first metal element.

The first film has a first thickness (d1 in FIG. 11B). The aluminum oxide film 12 has the first thickness d1.

Next, a hafnium oxide film 18 is formed on the second p-type semiconductor region 10*b* of the semiconductor layer 10. The hafnium oxide film 18 is an example of a fourth film. The hafnium oxide film 18 is selectively formed on the second p-type semiconductor region 10*b*. The hafnium oxide film 18 finally becomes the second upper part film 201*b*.

The fourth film contains a second metal element different from the first metal element and oxygen (O). Hafnium (Hf) is an example of the second metal element.

The fourth film has a fourth thickness (d4 in FIGS. 11C and 11D). The hafnium oxide film 18 has the fourth thickness d4.

It should be noted that the fourth film may be formed before the first film is formed. For example, the structure shown in FIG. 11C may be manufactured by forming the hafnium oxide film 18 before the aluminum oxide film 12 is formed.

Next, a silicon oxide film 14 is formed on the semiconductor layer 10 by radical oxidation (FIG. 11D). The silicon oxide film 14 is formed on the first p-type semiconductor region 10a. The silicon oxide film 14 is formed on the second p-type semiconductor region 10b.

The silicon oxide film 14 is formed by oxidizing the semiconductor layer 10 by radical oxidation. The silicon oxide film 14 is an example of the second film.

The silicon oxide film 14 on the first p-type semiconductor region 10a finally becomes the first lower part film 101a. In addition, the silicon oxide film 14 on the second p-type semiconductor region 10b finally becomes the second lower part film 201a.

The second thickness (d2 in FIG. 11D) of the silicon oxide film 14 between the first p-type semiconductor region 10a and the aluminum oxide film 12 is larger than the first thickness d1 of the aluminum oxide film 12. The third thickness (d3 in FIG. 11D) of the silicon oxide film 14 on the second p-type semiconductor region 10b is smaller than the second thickness d2 of the silicon oxide film 14. The third thickness d3 of the silicon oxide film 14 on the second p-type semiconductor region 10b is larger than the fourth thickness d4 of the hafnium oxide film 18.

The silicon oxide film 14 on the first p-type semiconductor region 10a is thicker than the silicon oxide film 14 on the second p-type semiconductor region 10b due to enhanced oxidation.

The degree of enhanced oxidation varies depending on the type of metal element contained in the film formed on the semiconductor layer 10 before radical oxidation. For example, when the film contains aluminum (Al), enhanced oxidation is promoted more than when the film contains hafnium (Hf). In addition, for example, when the film contains hafnium (Hf), enhanced oxidation is promoted more than when the film contains zirconium (Zr). In addition, for example, when the film contains zirconium (Zr), enhanced oxidation is promoted more than when the film contains titanium (Ti).

The degree of enhanced oxidation varies depending on the film type of the film formed on the semiconductor layer 10 before radical oxidation. For example, when the film is an aluminum oxide film, enhanced oxidation is promoted more than when the film is a hafnium oxide film. In addition, for example, when the film is a hafnium oxide film, enhanced oxidation is promoted more than when the film is a zirconium oxide film. In addition, for example, when the film is a zirconium oxide film, enhanced oxidation is promoted more than when the film is a titanium oxide film.

In the method for manufacturing a semiconductor device of the fifth embodiment, since the first film is the aluminum oxide film 12 and the fourth film is the hafnium oxide film 18, the enhanced oxidation of the first p-type semiconductor region 10a is promoted more than the enhanced oxidation of the second p-type semiconductor region 10b. Therefore, the silicon oxide film 14 on the first p-type semiconductor region 10a is thicker than the silicon oxide film 14 on the second p-type semiconductor region 10b.

Thereafter, the semiconductor device shown in FIG. 10 can be manufactured by forming the first gate electrode 102, the second gate electrode 202, and the n-type semiconductor region 10x using a known process technique.

As described above, according to the method for manufacturing a semiconductor device of the fifth embodiment, it is possible to oxidize the semiconductor layer at a low temperature to form oxide films having different thicknesses on the semiconductor layer.

Sixth Embodiment

The method for manufacturing a semiconductor device of the sixth embodiment is different from the method for manufacturing a semiconductor device of the third embodiment in that the first film is also formed on the second region, and the thickness on the second region of the first film is different from the thickness on the first region of the first film. Hereinafter, description of contents overlapping with those of the third embodiment may be partially omitted.

Figure 12:
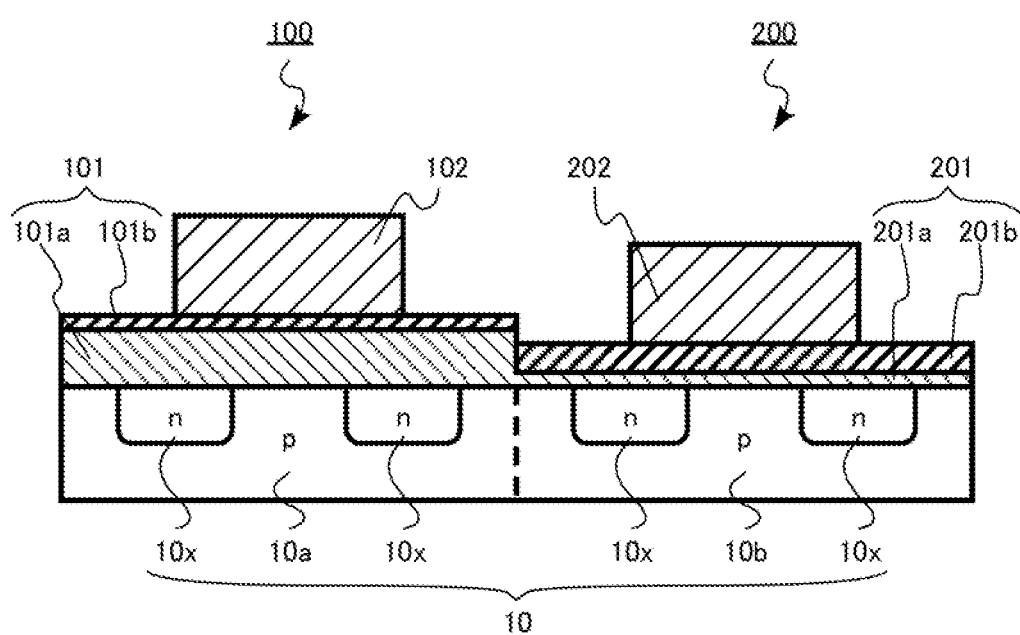
FIG. 12 is a schematic cross-sectional view of a semiconductor device manufactured by a method for manufacturing a semiconductor device of a sixth embodiment.

FIG. 12 is a schematic cross-sectional view of a semiconductor device manufactured by the method for manufacturing a semiconductor device of the sixth embodiment. The semiconductor device includes a first transistor 100 and a second transistor 200. The first transistor 100 and the second transistor 200 are MOSFETs.

The first transistor 100 includes a semiconductor layer 10, a first gate insulating layer 101, and a first gate electrode 102. The semiconductor layer 10 includes a first p-type semiconductor region 10a and an n-type semiconductor region 10x. The first gate insulating layer 101 includes a first lower part film 101a and a first upper part film 101b.

The first lower part film 101a of the first gate insulating layer 101 contains silicon (Si) and oxygen (O). The first lower part film 101a is, for example, a silicon oxide film. The first lower part film 101a is, for example, a silicon oxide film. The first upper part film 101b of the first gate insulating layer 101 contains a first metal element and oxygen (O). The first upper part film 101b is, for example, an aluminum oxide film. Aluminum (Al) is an example of the first metal element.

The second transistor 200 includes a semiconductor layer 10, a second gate insulating layer 201, and a second gate electrode 202. The semiconductor layer 10 includes a second p-type semiconductor region 10b and an n-type semiconductor region 10x. The second gate insulating layer 201 includes a second lower part film 201a and a second upper part film 201b.

The second transistor 200 of the sixth embodiment is different from the second transistor 200 of the third embodiment in that the second gate insulating layer 201 includes the second lower part film 201a and the second upper part film 201b.

The second gate insulating layer 201 contains silicon (Si) and oxygen (O). The second lower part film 201a of the second gate insulating layer 201 is, for example, a silicon oxide film. The second upper part film 201b of the second gate insulating layer 201 contains a first metal element and oxygen (O). The second upper part film 201b is, for example, an aluminum oxide film. Aluminum (Al) is an example of the first metal element.

The thickness of the first gate insulating layer 101 of the first transistor 100 is larger than the thickness of the second gate insulating layer 201 of the second transistor 200. The thickness of the first upper part film 101b of the first transistor 100 is different from the thickness of the second upper part film 201b of the second transistor 200. The thickness of the first upper part film 101b of the first transistor 100 is smaller than the thickness of the second upper part film 201b of the second transistor 200.

FIGS. 13A, 13B, 13C, and 13D are explanatory diagrams of the method for manufacturing a semiconductor device of the sixth embodiment.

Figure 13A:
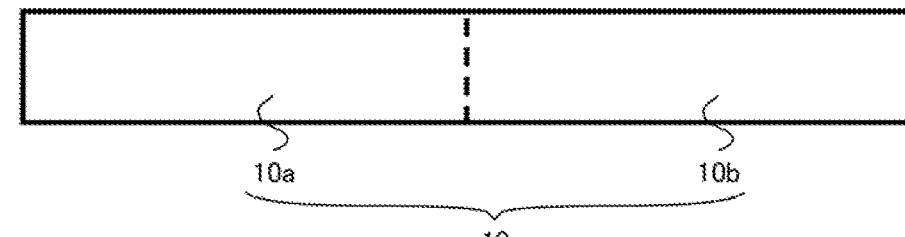
FIGS. 13A, 13B, 13C, and 13D are explanatory diagrams of the method for manufacturing a semiconductor device of the sixth embodiment.

First, a semiconductor layer 10 is prepared (FIG. 13A). The semiconductor layer 10 includes a first p-type semiconductor region 10a and a second p-type semiconductor region 10b.

Figure 13B:
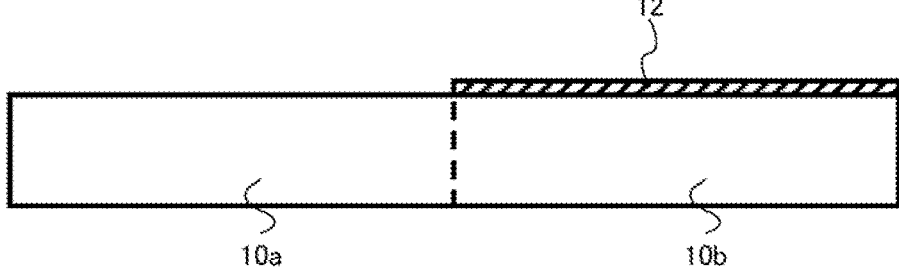

Next, an aluminum oxide film 12 is selectively formed on the second p-type semiconductor region 10b of the semiconductor layer 10 (FIG. 13B).

Figure 13C:
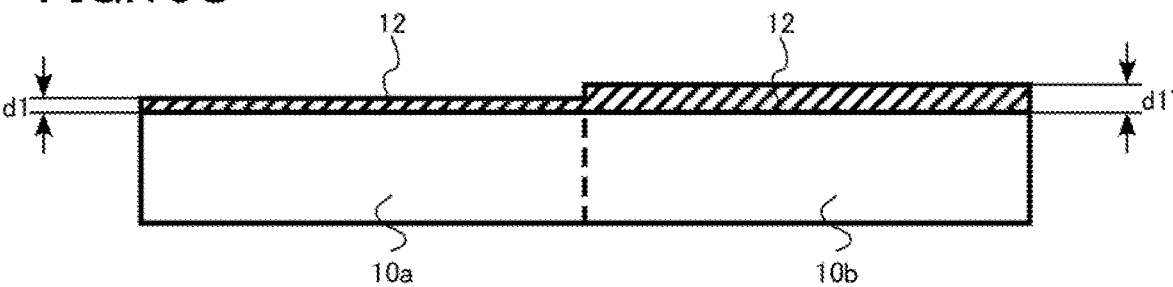

Next, the aluminum oxide film 12 is formed on the first p-type semiconductor region 10a and the second p-type semiconductor region 10b of the semiconductor layer 10 (FIG. 13C). As a result, the thickness (d1' in FIG. 13C) of the aluminum oxide film 12 on the second p-type semiconductor region 10b is larger than the thickness (d1 in FIG. 13C) of the aluminum oxide film 12 on the first p-type semiconductor region 10a.

The aluminum oxide film 12 is an example of the first film. The aluminum oxide film 12 on the first p-type semiconductor region 10a finally becomes the first upper part film 101b. The aluminum oxide film 12 on the second p-type semiconductor region 10b finally becomes the second upper part film 201b. Aluminum (Al) is an example of the first metal element.

Figure 13D:
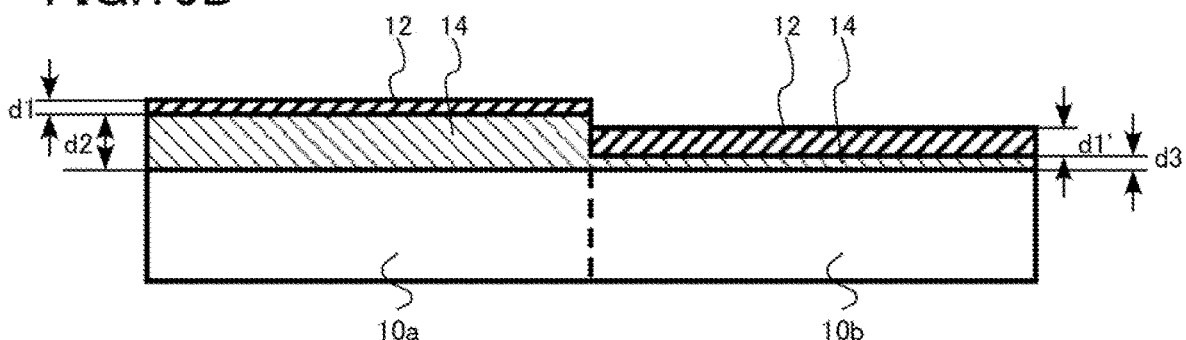

Next, a silicon oxide film 14 is formed on the semiconductor layer 10 by radical oxidation (FIG. 13D). The silicon oxide film 14 is formed on the first p-type semiconductor region 10a. The silicon oxide film 14 is formed on the second p-type semiconductor region 10b.

The silicon oxide film 14 is formed by oxidizing the semiconductor layer 10 by radical oxidation. The silicon oxide film 14 is an example of the second film.

The silicon oxide film 14 on the first p-type semiconductor region 10a finally becomes the first lower part film 101a. In addition, the silicon oxide film 14 on the second p-type semiconductor region 10b finally becomes the second lower part film 201a.

The second thickness (d2 in FIG. 13D) of the silicon oxide film 14 between the first p-type semiconductor region 10a and the aluminum oxide film 12 is larger than the first thickness d1 of the aluminum oxide film 12. The third thickness (d3 in FIG. 13D) of the silicon oxide film 14 on the second p-type semiconductor region 10b is smaller than the second thickness d2 of the silicon oxide film 14.

The silicon oxide film 14 on the first p-type semiconductor region 10a is thicker than the silicon oxide film 14 on the second p-type semiconductor region 10b due to enhanced oxidation.

The degree of enhanced oxidation varies depending on the thickness of the first film formed on the semiconductor layer 10. For example, when the first film is thicker than a predetermined thickness, enhanced oxidation is suppressed. The predetermined thickness in this case is, for example, 5 nm. In addition, for example, when the first film becomes thinner than a predetermined thickness, enhanced oxidation is suppressed. The predetermined thickness in this case is, for example, 1 nm.

According to the method for manufacturing a semiconductor device of the sixth embodiment, the thickness of the aluminum oxide film 12 on the second p-type semiconductor region 10b is made larger than the thickness of the aluminum oxide film 12 on the first p-type semiconductor region 10a, whereby enhanced oxidation is suppressed. Therefore, the silicon oxide film 14 on the first p-type semiconductor region 10a is thicker than the silicon oxide film 14 on the second p-type semiconductor region 10b.

Thereafter, the semiconductor device shown in FIG. 12 can be manufactured by forming the first gate electrode 102, the second gate electrode 202, and the n-type semiconductor region 10x using a known process technique.

As described above, according to the method for manufacturing a semiconductor device of the sixth embodiment, it is possible to oxidize the semiconductor layer at a low temperature to form oxide films having different thicknesses on the semiconductor layer.

In the third to sixth embodiments, the cases where the gate insulating layers having different thicknesses are formed have been described as examples. However, for example, the method of manufacturing a semiconductor device of the present disclosure can also be applied to other cases where oxide films having different thicknesses are formed on the same semiconductor layer, such as a case where capacitor insulating layers having different thicknesses are formed.

While certain embodiments have been described, these embodiments have been presented by way of example only, and are not intended to limit the scope of the inventions. Indeed, the method for manufacturing a semiconductor device described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
   forming a third film containing silicon (Si), oxygen (O), and nitrogen (N) directly on a semiconductor layer containing silicon (Si);
   forming a first film on the third film, the first film containing a metal element and oxygen (O) and having a first thickness; and
   forming a second film between the semiconductor layer and the third film using radical oxidation, the second film containing silicon (Si) and oxygen (O), the second film having a second thickness larger than the first thickness, and the second film being in direct contact with the semiconductor layer and the third film,
   wherein the second thickness is 10 times or more the first thickness.

2. The method for manufacturing a semiconductor device according to claim 1, wherein the first thickness is equal to or more than 1 nm and equal to or less than 5 nm.

3. The method for manufacturing a semiconductor device according to claim 1, wherein a temperature of the radical oxidation is equal to or more than 300° C. and equal to or less than 900° C.

4. The method for manufacturing a semiconductor device according to claim 1, wherein the first film contains at least one element selected from a group consisting of nitrogen (N), carbon (C), hydrogen (H), fluorine (F), and chlorine (Cl).

5. The method for manufacturing a semiconductor device according to claim 1, wherein hydrogen (H) and oxygen (O) are contained in an atmosphere of the radical oxidation, and an atomic ratio (H/(H+O)) of hydrogen (H) to a sum of hydrogen (H) and oxygen (O) is equal to or less than 40%.

6. The method for manufacturing a semiconductor device according to claim 1, wherein hydrogen (H) and oxygen (O) are contained in an atmosphere of the radical oxidation, and an atomic ratio (H/(H+O)) of hydrogen (H) to a sum of hydrogen (H) and oxygen (O) is equal to or more than 2% and equal to or less than 5%.

7. The method for manufacturing a semiconductor device according to claim 1, wherein the metal element is at least one metal element selected from a group consisting of aluminum (Al), hafnium (Hf), zirconium (Zr), lanthanum (La), yttrium (Y), titanium (Ti), nickel (Ni), zinc (Zn), indium (In), tin (Sn), gallium (Ga), and tungsten (W).

8. The method for manufacturing a semiconductor device according to claim 1, wherein the semiconductor layer is a monocrystalline silicon layer or a polycrystalline silicon layer.

9. A method for manufacturing a semiconductor device, the method comprising:

forming an aluminum oxide film on a semiconductor layer containing silicon (Si), the aluminum oxide film having a first thickness; and forming a silicon oxide film between the semiconductor layer and the aluminum oxide film using radical oxidation, the silicon oxide film having a second thickness larger than the first thickness, wherein the first thickness is equal to or more than 1 nm and equal to or less than 5 nm and the second thickness is equal to or more than 10 nm and equal to or less than 300 nm.

10. The method for manufacturing a semiconductor device according to claim 9, further comprising forming a silicon oxynitride film containing silicon (Si), oxygen (O), and nitrogen (N) directly on the semiconductor layer before the forming the aluminum oxide film, wherein the silicon oxide film is formed between the semiconductor layer and the silicon oxynitride film, the silicon oxide film being in direct contact with the semiconductor layer and the aluminum oxide film, and the second thickness is 10 times or more the first thickness.

11. The method for manufacturing a semiconductor device according to claim 9, wherein a temperature of the radical oxidation is equal to or more than 300° C. and equal to or less than 900° C., a pressure of the radical oxidation is equal to or more than 50 Pa and equal to or less than 3000 Pa, and hydrogen (H) and oxygen (O) are contained in an atmosphere of the radical oxidation, and an atomic ratio $(H/(H+O))$ of hydrogen (H) to a sum of hydrogen (H) and oxygen (O) is equal to or more than 2% and equal to or less than 5%.

12. The method for manufacturing a semiconductor device according to claim 9, wherein the aluminum oxide film contains at least one element selected from a group consisting of nitrogen (N), carbon (C), hydrogen (H), fluorine (F), and chlorine (Cl).

* * * * *